(12) United States Patent
Hsu et al.

(10) Patent No.: US 8,123,552 B2
(45) Date of Patent: Feb. 28, 2012

(54) PORTABLE STORAGE DEVICE BOX

(75) Inventors: Ching-Chung Hsu, Tu-cheng (TW); Min-Lun Ma, Tu-cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 1022 days.

(21) Appl. No.: 12/075,586

(22) Filed: Mar. 12, 2008

(65) Prior Publication Data

US 2008/0227380 A1    Sep. 18, 2008

(30) Foreign Application Priority Data

Mar. 12, 2007   (TW) .............................. 96203925 U

(51) Int. Cl.
*H01R 13/72* (2006.01)

(52) U.S. Cl. ........................................................ 439/501

(58) Field of Classification Search .................. 439/501, 439/4, 528; 191/12.4
See application file for complete search history.

(56) References Cited

U.S. PATENT DOCUMENTS

| | | | | |
|---|---|---|---|---|
| 1,747,411 | A | * | 2/1930 | Anderson ........................ 439/25 |
| 2,521,226 | A | * | 9/1950 | Keller ............................ 242/395 |
| 4,942,964 | A | * | 7/1990 | Hsu ................................ 206/702 |
| 5,481,607 | A | * | 1/1996 | Hsiao ............................ 379/438 |
| 5,684,883 | A | * | 11/1997 | Chen ............................. 381/385 |
| 5,701,981 | A | * | 12/1997 | Marshall et al. .............. 191/12.4 |
| 5,738,548 | A | * | 4/1998 | Rutulante ...................... 439/652 |
| 5,773,757 | A | * | 6/1998 | Kenney et al. ................. 174/53 |
| 5,991,530 | A | * | 11/1999 | Okada et al. ..................... 703/25 |
| 6,299,477 | B1 | * | 10/2001 | Rohrbach et al. ............. 439/501 |
| 6,315,231 | B1 | * | 11/2001 | Liaom ........................ 242/378.1 |
| 6,325,665 | B1 | * | 12/2001 | Chung .......................... 439/501 |
| 6,337,444 | B1 | * | 1/2002 | Liao ............................. 174/135 |
| 6,371,398 | B1 | * | 4/2002 | Liao ............................ 242/378.1 |
| 6,374,970 | B1 | * | 4/2002 | Liao ............................. 191/12.4 |
| 6,378,797 | B1 | * | 4/2002 | Liao ............................ 242/378.1 |
| 6,401,892 | B1 | * | 6/2002 | Chang .......................... 191/12.4 |
| 6,416,355 | B1 | * | 7/2002 | Liao ............................. 439/501 |
| 6,433,274 | B1 | * | 8/2002 | Doss et al. ...................... 174/50 |
| 6,437,464 | B1 | * | 8/2002 | Neal ............................... 310/43 |
| 6,439,360 | B1 | * | 8/2002 | Miller ....................... 191/12.2 R |
| 6,542,757 | B2 | * | 4/2003 | Bae ............................. 455/575.2 |
| 6,617,721 | B1 | * | 9/2003 | Neal ............................ 310/68 D |

(Continued)

FOREIGN PATENT DOCUMENTS

CN    2565077 Y    8/2003

(Continued)

*Primary Examiner* — Tulsidas C Patel
*Assistant Examiner* — Vladimir Imas
(74) *Attorney, Agent, or Firm* — Wei Te Chung; Andrew C. Cheng; Ming Chieh Chang

(57) ABSTRACT

A portable storage device box includes a cover, a hard disk in the cover, a transfer module and a control circuit in the cover. The cover comprises an upper cover, a base portion and a cutout. The transfer module comprises a spool, a telescopic plug, a control button and a clockwork device towed by the cable. The control circuit connects the hard disk to the transfer module. The plug comprises an electric connector and a cable connecting the electric connector and winded on the spool. When the electric connector is drawn out the clockwork device would be towed by the cable and be fixed by pressing the control button once, and if the control button is pressed once again, the clockwork device would be released to restore with drawing the plug back.

10 Claims, 2 Drawing Sheets

U.S. PATENT DOCUMENTS

| | | | |
|---|---|---|---|
| 6,866,218 B2* | 3/2005 | Liao | 242/378.1 |
| 7,001,210 B1* | 2/2006 | Chiang | 439/501 |
| 7,032,728 B2* | 4/2006 | Harcourt | 191/12.2 R |
| 7,097,018 B2* | 8/2006 | Wu | 191/12.2 R |
| 7,159,700 B2* | 1/2007 | Liao | 191/12.4 |
| 7,255,595 B2* | 8/2007 | Lo | 439/501 |
| 7,576,953 B1* | 8/2009 | McGrath | 360/256.2 |
| 7,654,860 B2* | 2/2010 | Shih et al. | 439/501 |
| 7,666,007 B2* | 2/2010 | Hsu et al. | 439/79 |
| 7,667,925 B2* | 2/2010 | Kim et al. | 360/97.02 |
| 2003/0008550 A1* | 1/2003 | Tse et al. | 439/501 |
| 2004/0157487 A1* | 8/2004 | Laity et al. | 439/501 |
| 2007/0133122 A1* | 6/2007 | Kim et al. | 360/97.01 |
| 2007/0149029 A1* | 6/2007 | Hwang | 439/352 |
| 2007/0270026 A1* | 11/2007 | Lo | 439/499 |
| 2008/0061979 A1* | 3/2008 | Hause et al. | 340/572.1 |
| 2008/0065676 A1* | 3/2008 | Hause et al. | 707/102 |
| 2008/0084393 A1* | 4/2008 | Kang et al. | 345/166 |
| 2008/0261441 A1* | 10/2008 | Shih et al. | 439/501 |

FOREIGN PATENT DOCUMENTS

CN 2733519 Y 10/2005

* cited by examiner

PORTABLE STORAGE DEVICE BOX

BACKGROUND OF THE INVENTION

1. Field of the Invention

The present invention relates generally to a portable storage device box, and more particularly to a portable storage device box used with a USB plug.

2. Description of the Prior Art

To facilitate data transfer, most of current portable storage devices use USB cable connectors to connect computers. A portable storage device box is always used to be a cover and an adapter to receive a storage hard drive. And the box connects the computer through a USB cable connector. To carry conveniently the portable storage box usually comprises a USB connector to connect the computer directly. However, current portable storage box always fixes a USB connector thereon. This USB connector is easily damaged, because it needs to burden heavy weight of the box when it is connected to the computer.

Hence, an improved portable storage device box with a telescopic USB plug is desired to overcome the above-mentioned shortcomings of the existing boxes.

BRIEF SUMMARY OF THE INVENTION

A primary object, therefore, of the present invention is to provide a portable storage device box receiving a telescopic USB connector which can be drawn out and back in use.

In order to implement the above object and overcomes the above-identified deficiencies in the prior art, the portable storage device box comprises a cover, a hard disk in the cover, a transfer module and a control circuit in the cover. The cover comprises an upper cover, a base portion and a cutout. The transfer module comprises a spool, a telescopic plug, a control button and a clockwork device towed by the cable. The control circuit connects the hard disk to the transfer module. The plug comprises an electric connector and a cable connecting the electric connector and winded on the spool. When the electric connector is drawn out the clockwork device would be towed by the cable and be fixed by pressing the control button once, and if the control button is pressed once again, the clockwork device would be released to restore with drawing the plug back.

Other objects, advantages and novel features of the invention will become more apparent from the following detailed description of a preferred embodiment when taken in conjunction with the accompanying drawings.

DETAILED DESCRIPTION OF THE INVENTION

Reference will now be made in detail to a preferred embodiment of the present invention.

Figure 1:
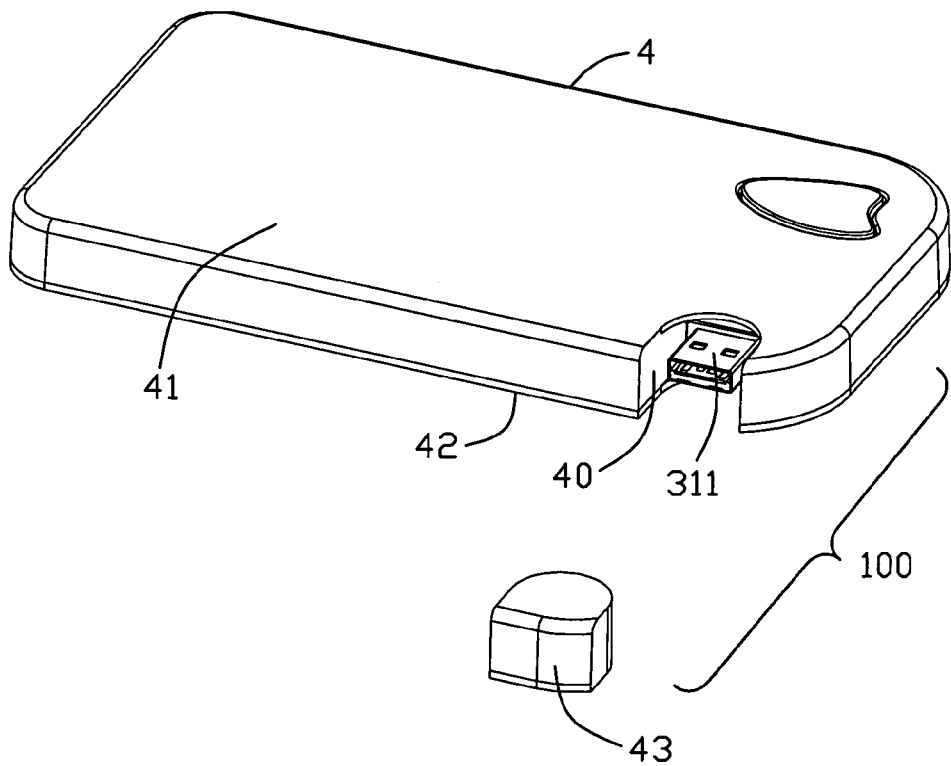
FIG. 1 is a perspective view illustrating a portable storage device according to a preferred embodiment of the present invention.
Figure 2:
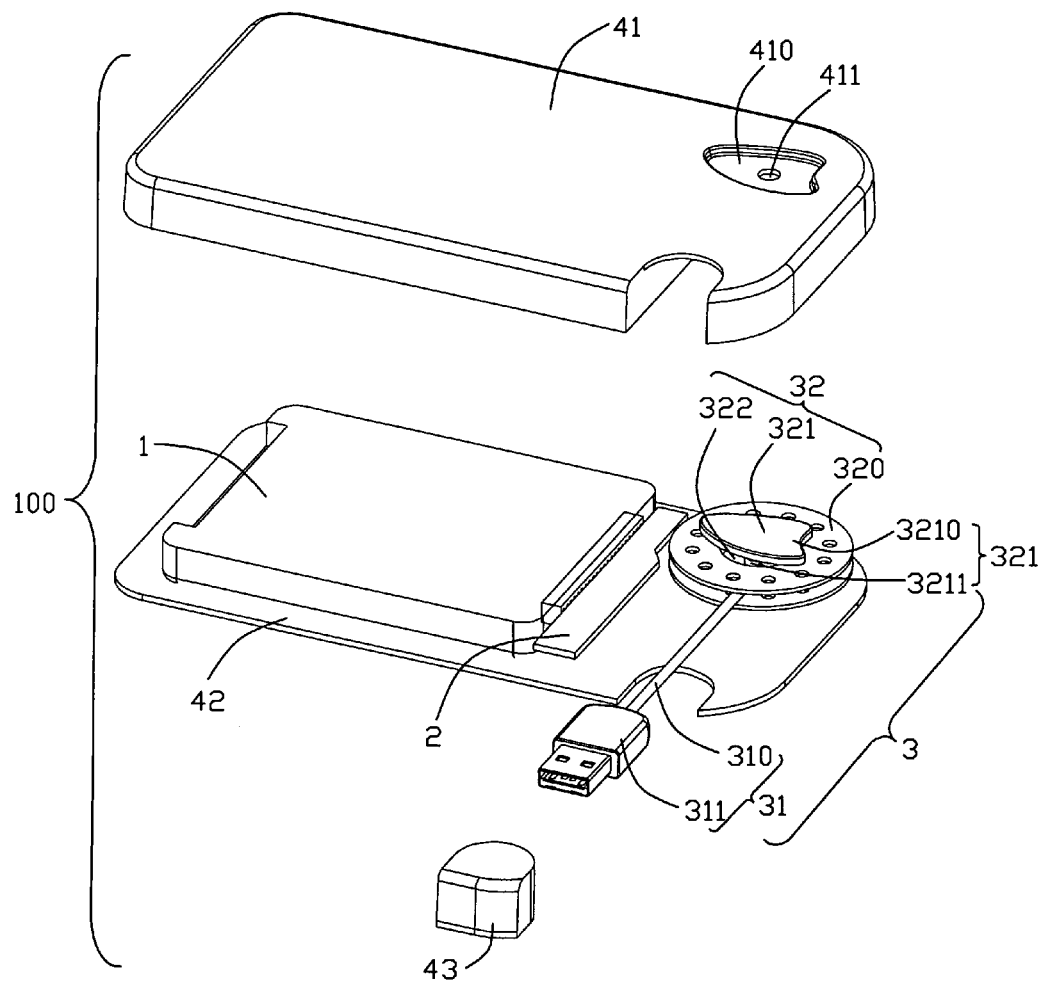
FIG. 2 is a exploded, perspective view of FIG. 1.

Reference to FIG. 1 and FIG. 2, perspective views of a portable storage device 100 in accordance with a preferred embodiment of the present invention are shown.

The portable storage device box 100 comprises a hard disk 1, a control circuit 2, transfer module 3 and a cover 4.

The cover 4 comprises an upper cover 41, a lower base portion 42, a cutout 40 and a complementary portion 43 assembled in the cutout 40 to form an unitary cover 4 with the upper cover 41, the base portion 42. The upper cover 41 comprises a receiving space 410 on the upper surface thereof, and a hole 411 connects the receiving space 410 and the inner space of the cover 41. The hard disk 1, the control circuit 2 and the transfer module 3 are fixed on the base portion 42 and received in the receiving space among the upper cover 41 and the base portion 42.

The transfer module 3 electrically connects to the hard disk 1 through the control circuit 2 and comprises a USB plug 31 and a wind cable device 32. The plug 31 comprises a cable 310 and an electric connector 311 connecting the cable 310. The plug 31 is received in the cutout 40 and the complementary portion 43 is assembled in the cutout 40 to cover the electric connector 311. The wind cable device 32 comprises a spool 320, a handling portion 321 and a clockwork device 322 around the axis of the wind cable device 32. The handling portion 321 comprises a control button 3210 received in the receiving space 410 of the upper cover 41 and a central axis 3211 through the hole 411 to fix the handling portion 321 on the base portion 42. The spool 320 can be control by pressing the handling portion 321 and the clockwork device 322. When the plug 31 is drawn out, the cable 310 would tow the clockwork device 322. And then, if the control button 3210 is pressed once, the clockwork device 322 would be fixed. If the control button 3210 is pressed once again, the clockwork device 322 would be released to restore and the plug 31 would be drawn back by the clockwork device 322.

In use, the plug 31 could be drawn out to be fixed on a right length through the configuration of the present invention. When the plug 31 is drawn out, the control button 321 could be pressed once to fix the length of the cable 310, and then the plug 31 could be taken back through pressing the control button 321 once again.

While the foregoing description includes details which will enable those skilled in the art to practice the invention, it should be recognized that the description is illustrative in nature and that many modifications and variations thereof will be apparent to those skilled in the art having the benefit of these teachings. It is accordingly intended that the invention herein be defined solely by the claims appended hereto and that the claims be interpreted as broadly as permitted by the prior art.

What is claimed is:

1. A portable storage device box, comprises
  a cover comprising an upper cover, a base portion, a cutout;
  a hard disk received in the cover;
  a transfer module comprising a spool, a telescopic plug, a control button and a clockwork device towed by the cable; and
  a control circuit in the cover, connecting the hard disk to the transfer module;
  wherein said plug comprising an electric connector and a cable connecting the electric connector and winded on the spool, when the electric connector is drawn out the clockwork device would be towed by the cable and be fixed by pressing the control button once, and if the control button is pressed once again, the clockwork device would be released to restore with drawing the plug back.

2. The portable storage device box as claimed in claim 1, wherein said electric connector is made according to the USB standard.

3. The portable storage device box as claimed in claim 1, wherein said cover further comprises a complementary portion assembled in the cutout, said upper cover, base portion and the complementary portion compose of a unitary cover.

4. The portable storage device box as claimed in claim 3, wherein said complementary cover is used to protect the electric connector.

5. The portable storage device box as claimed in claim 1, wherein said upper cover has a receiving space on the surface thereof and the control button is received in the receiving space.

6. The portable storage device box as claimed in claim 5, wherein said upper cover further comprises a hole connecting the receiving space and the inner space of the cover.

7. The portable storage device box as claimed in claim 6, wherein said transfer module further comprises a central post to fix the control button on the base portion.

8. A portable storage device comprising:
 a casing defining an interior space and a cutout in communicating said interior space with an exterior;
 a hard disk received in the casing;
 a transfer module disposed in the casing and including:
  a spool with an associated cable having one end terminated at a plug and the other end electrically connected to the hard disk wherein said plug is moveable disposed in the cutout;
  a clockwork located around the spool and moveable corresponding to the cable; and
  a control button located around the spool and exposed on the casing and to said exterior; wherein
  the clockwork is releasably fixed relative to the spool via said control button so as to decide how long the cable extends out of the casing.

9. The portable storage device as claimed in claim 8, wherein both said transfer module and said plug are located on a same side with regard to the hard disk in said casing.

10. The portable storage device as claimed in claim 8, wherein said cable and said hard disk are electrically connected via a control circuit.

* * * * *